United States Patent

(12) United States Patent
Chang et al.

(10) Patent No.: US 10,486,204 B2
(45) Date of Patent: Nov. 26, 2019

(54) SEMICONDUCTOR APPARATUS AND METHOD OF REMOVING PHOTORESIST LAYER ON SUBSTRATE

(71) Applicant: TAIWAN SEMICONDUCTOR MANUFACTURING CO., LTD., Hsinchu (TW)

(72) Inventors: Jui-Chuan Chang, Zhubei (TW); Shao-Yen Ku, Jhubei (TW); Wen-Chang Tsai, Hsinchu (TW); Shang-Yuan Yu, Hsinchu (TW); Chien-Wen Hsiao, Hsinchu (TW); Fan-Yi Hsu, Toufen Town (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 156 days.

(21) Appl. No.: 14/535,163

(22) Filed: Nov. 6, 2014

(65) Prior Publication Data

US 2016/0129484 A1    May 12, 2016

(51) Int. Cl.
*B08B 7/00* (2006.01)
*H01L 21/311* (2006.01)
*H01L 21/67* (2006.01)

(52) U.S. Cl.
CPC ...... *B08B 7/0057* (2013.01); *H01L 21/31138* (2013.01); *H01L 21/67115* (2013.01)

(58) Field of Classification Search
CPC ......... H01L 21/31138; H01L 21/67115; B08B 7/0057
See application file for complete search history.

(56) References Cited

U.S. PATENT DOCUMENTS

| 7,037,560 | B1 * | 5/2006 | Shinriki | C23C 16/405 427/255.31 |
| 2002/0029788 | A1 * | 3/2002 | Verhaverbeke | B08B 3/02 134/1.3 |
| 2002/0035762 | A1 * | 3/2002 | Okuda | B08B 1/04 15/77 |
| 2002/0096196 | A1 * | 7/2002 | Toshima | B08B 3/04 134/21 |

(Continued)

FOREIGN PATENT DOCUMENTS

| JP | 01272120 A | * 10/1989 |
| JP | 02201916 A | * 8/1990 |

OTHER PUBLICATIONS

Abstract: JP01-272120; Inada et al; 1989.*
Machine translation: JP02201916; Tanaka et al. (Year: 1990).*

*Primary Examiner* — Mikhail Kornakov
*Assistant Examiner* — Natasha N Campbell
(74) *Attorney, Agent, or Firm* — Maschoff Brennan

(57) ABSTRACT

A semiconductor apparatus for removing a photoresist layer on a substrate includes a platform, a first ultraviolet lamp, and an ozone supplier. The platform is used to support the substrate. The first ultraviolet lamp is used to provide first ultraviolet light. The ozone supplier has at least one first nozzle for introducing ozone toward the substrate through the first ultraviolet light, such that at least a part of the ozone is decomposed by the first ultraviolet light, and at least a part of the decomposed ozone reaches the photoresist layer to react with the photoresist layer. Moreover, a method of removing a photoresist layer on a substrate is also provided.

21 Claims, 4 Drawing Sheets

(56) References Cited

U.S. PATENT DOCUMENTS

| | | | | |
|---|---|---|---|---|
| 2004/0082251 | A1* | 4/2004 | Bach | C23C 16/45563 |
| | | | | 445/60 |
| 2004/0209194 | A1* | 10/2004 | Kume | H01L 21/0206 |
| | | | | 430/313 |
| 2004/0211756 | A1* | 10/2004 | Kume | H01L 21/31111 |
| | | | | 216/92 |
| 2014/0248720 | A1* | 9/2014 | Reichel | G01J 5/0007 |
| | | | | 438/14 |

* cited by examiner

SEMICONDUCTOR APPARATUS AND METHOD OF REMOVING PHOTORESIST LAYER ON SUBSTRATE

BACKGROUND

The present disclosure relates to semiconductor apparatuses. When a photoresist (PR) strip process is performed on a semiconductor wafer, a photoresist layer on the semiconductor wafer may be removed from a surface of the semiconductor wafer. In a conventional photoresist strip process, Caro's acid is often used to strip the photoresist layer from the surface of the semiconductor wafer. However, Caro's acid is formed by the mixture of sulfuric acid ($H_2SO_4$) and hydrogen peroxide ($H_2O_2$), so that Caro's acid is referred to as an environment-unfriendly liquid. After the photoresist layer is removed from the semiconductor wafer by Caro's acid, drained liquid may pollute environment.

Moreover, in previous processes, poly lines are formed on the semiconductor wafer and covered by the photoresist layer. When Caro's acid is in contact with the photoresist layer that covers the poly lines, the photoresist layer and Caro's acid induce poly damage due to violent reaction therebetween, such that poly peeling defects caused by the violent thermal stress of Caro's acid are formed on the semiconductor wafer. In addition, when the photoresist strip process is performed on the semiconductor wafer, the temperature of the semiconductor wafer may be gradually decreased from the center region of the semiconductor wafer to the edge region of the semiconductor wafer. Since a low stripping rate occurs at a low temperature region of the semiconductor wafer, edge remain defects may be formed on the edge region of the semiconductor wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
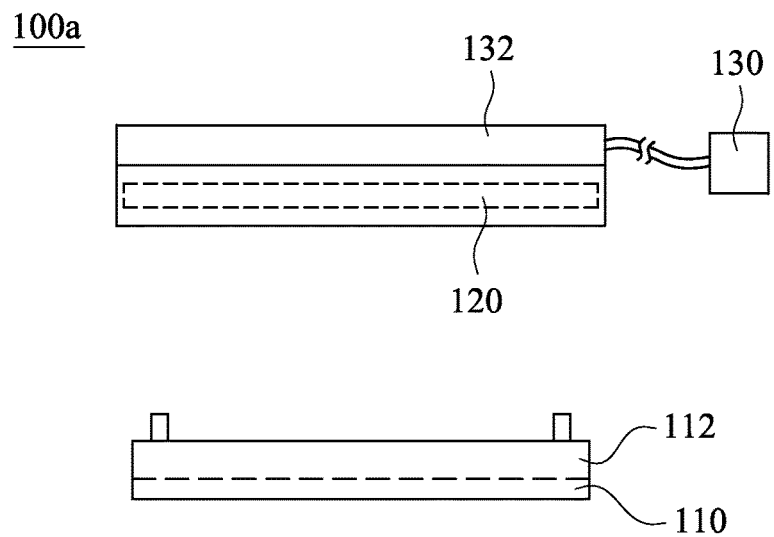
FIG. 1 is a front view of a semiconductor apparatus for removing a photoresist layer on a substrate according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

During a photoresist (PR) strip process of a semiconductor wafer, a conventional photoresist stripping apparatus releases Caro's acid to remove a photoresist layer on the wafer. After the photoresist layer is removed from a surface of the wafer, the wafer may be transfer to a next deposition station or a measurement station. However, Caro's acid may pollute environment, and poly damage may occur on the wafer due to violent reaction between the photoresist layer and Caro's acid. Once the violent thermal stress of Caro's acid damages the poly lines of the wafer, after the photoresist layer is stripped from the wafer, the poly lines of the wafer will be exposed so as to form poly peeling defects. Therefore, if Caro's acid is used to remove the photoresist layer by the photoresist stripping apparatus, environmental pollution and the poly peeling defects cannot be effectively solved.

FIG. 1 is a front view of a semiconductor apparatus 100a for removing a photoresist layer on a substrate according to some embodiments of the present disclosure. As shown in FIG. 1, the semiconductor apparatus 100a includes a platform 110, a first ultraviolet lamp 120, and an ozone supplier 130. The ozone supplier 130 has at least one first nozzle 132. The first ultraviolet lamp 120 is located between the first nozzle 132 and the platform 110. In use, the ozone supplier 130 may provide ozone toward the platform 110 through the first nozzle 132 and the first ultraviolet lamp 120. In some embodiments, the first ultraviolet lamp 120 is adjacent to the first nozzle 132.

Figure 2:
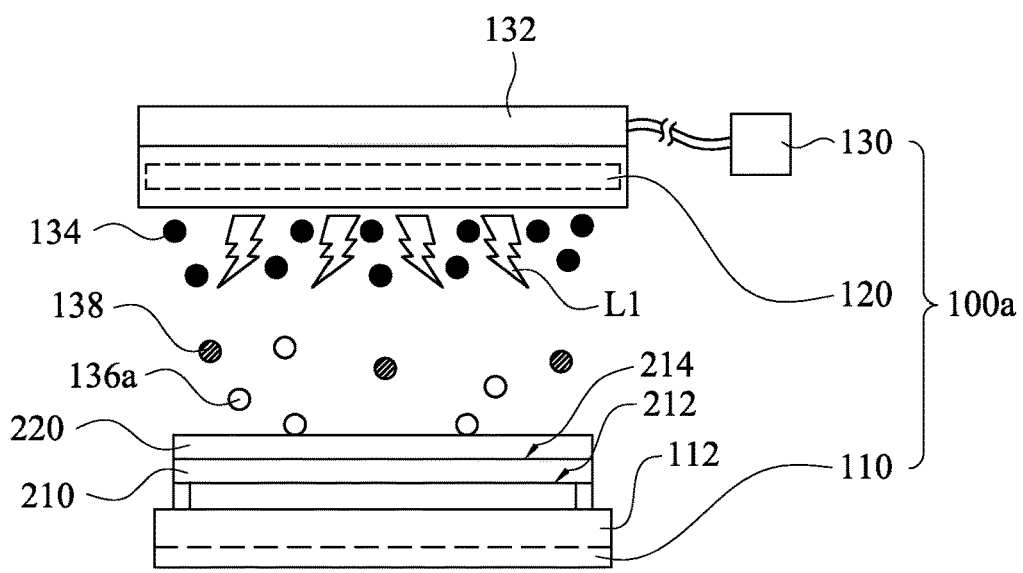
FIG. 2 is a schematic view of the semiconductor apparatus shown in FIG. 1 when being in operation.

FIG. 2 is a schematic view of the semiconductor apparatus 100a shown in FIG. 1 when being in operation. As shown in FIG. 2, the platform 110 is used to support a substrate 210. The substrate 210 has a backside 212 and a front side 214 opposite to the backside 212. Before the substrate 210 is moved to the semiconductor apparatus 100a, a photoresist layer 220 has been already formed on the front side 214 of the substrate 210 by a photolithography process. The aforesaid photolithography process may include a photoresist coating process (e.g., a spin coating process or a spray coating process), an exposure process, a development process, and an etching process, but the present disclosure is not limited in this regard.

In some embodiments, the substrate 210 may be a thin slice of semiconductor material, such as a silicon crystal, used in the fabrication of integrated circuits (IC) and other microelectronic devices. The substrate 210 may undergo micro fabrication processes, such as chemical vapor deposition (CVD) process, physical vapor deposition (PVD) process, and patterning process.

The semiconductor apparatus 100a is used to remove the photoresist layer 220 on the substrate 210. When the semiconductor apparatus 100a is in operation, the platform 110 supports the substrate 210, and the first ultraviolet lamp 120 provides first ultraviolet light L1. The ozone supplier 130 having the first nozzle 132 introduces ozone 134 toward the substrate 210 through the first ultraviolet light L1, such that the first ultraviolet light L1 irradiates the ozone 134. As a result, at least a part of the ozone 134 is decomposed by the first ultraviolet light L1, and at least a part of the decomposed ozone reaches the photoresist layer 220 to react with the photoresist layer 220. The decomposed part of the ozone 134 may be decomposed into atomic oxygen 136a and dioxygen 138 (i.e., $O_2$) by the first ultraviolet light L1.

In some embodiments, the first ultraviolet light L1 has a wavelength in a range from about 245 nm to about 260 nm, such as 253.7 nm. The UV energy of the first ultraviolet light L1 that has the aforesaid wavelength is about 472 KJ/mol. Since the UV energy of the first ultraviolet light L1 is greater than the bond energy of the organic molecules of the photoresist layer 220, the atomic oxygen 136a may react with the organic molecules or the free radicals of the photoresist layer 220 to form other molecules, such as $CO_2$, $H_2O$, $N_2$, etc. As a result, the photoresist layer 220 may be removed from the substrate 210.

The photoresist layer 220 is removed by the ozone 134 and the first ultraviolet light L1. The first ultraviolet light L1 do not pollute environment, the ozone 134 is an environment-friendly molecule, and the decomposed photoresist layer also forms environment-friendly molecules (e.g., $CO_2$, $H_2O$, and $N_2$). Therefore, the semiconductor apparatus 100a of the present disclosure is good for environmental protection.

Moreover, since thermal stress of conventional Caro's acid does not occur in the semiconductor apparatus 100a, poly damages and poly peeling defects are not apt to be formed on the substrate 210 after the photoresist layer 220 is removed by the semiconductor apparatus 100a. Hence, the yield rate of the substrate 210 may be improved.

The platform 110 of the semiconductor apparatus 100a may include a hot plate 112. The hot plate 112 is under the substrate 210 and configured to heat the substrate 210. When the temperature of the substrate 210 is increased, the reaction rate between the photoresist layer 220 and the atomic oxygen 136a is increased. That is to say, the stripping rate of the photoresist layer 220 may be improved. Furthermore, the temperature of the substrate 210 may be uniform due to the configuration of the hot plate 112. Therefore, the edge region of the substrate 210 may be similar to the center region of the substrate 210. As a result, after the photoresist layer 220 is removed, edge remain defects are not formed on the edge region of the substrate 210.

Figure 3:
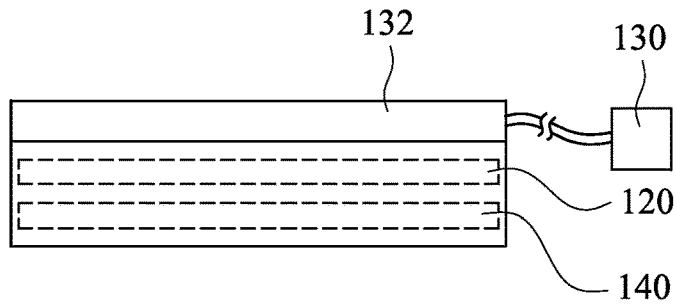
FIG. 3 is a front view of a semiconductor apparatus according to some embodiments of the present disclosure.
Figure 3:
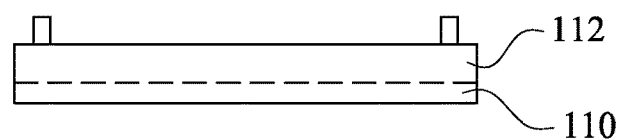

FIG. 3 is a front view of a semiconductor apparatus 100b according to some embodiments of the present disclosure. As shown in FIG. 3, the semiconductor apparatus 100b includes the platform 110, the first ultraviolet lamp 120, and the ozone supplier 130. The ozone supplier 130 has the first nozzle 132. The difference between this embodiment and the embodiment shown in FIG. 1 is that the semiconductor apparatus 100b further includes a second ultraviolet lamp 140. The wavelength of the second ultraviolet lamp 140 is different form the wavelength of the first ultraviolet lamp 120. In some embodiments, the second ultraviolet lamp 140 has a wavelength in a range from about 180 nm to about 190 nm, such as 184.9 nm.

Figure 4:
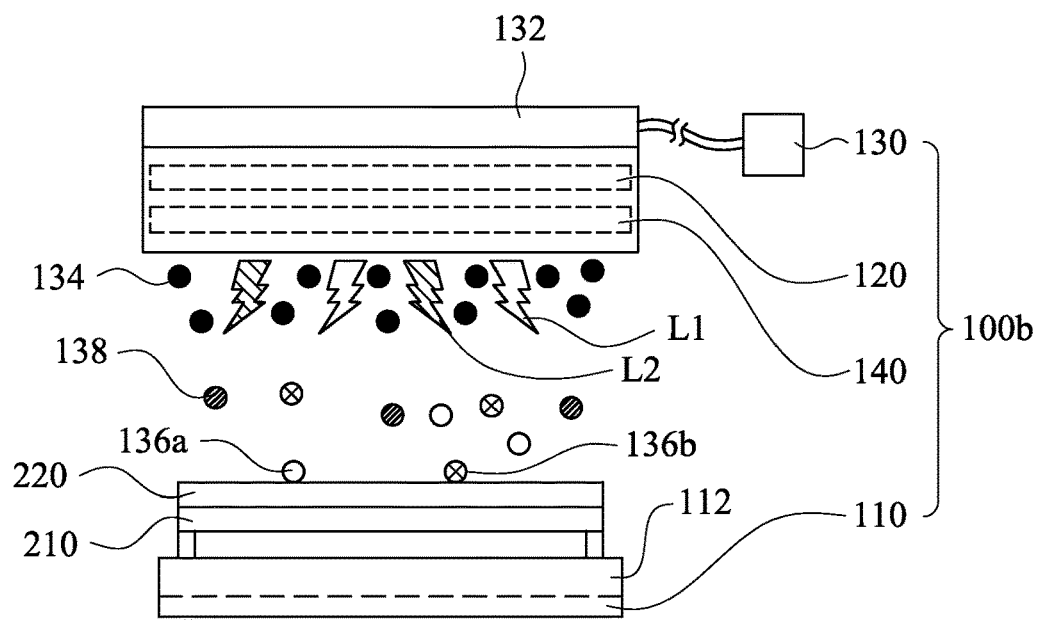
FIG. 4 is a schematic view of the semiconductor apparatus shown in FIG. 3 when being in operation.

FIG. 4 is a schematic view of the semiconductor apparatus 100b shown in FIG. 3 when being in operation. As shown in FIG. 4, when the semiconductor apparatus 100b is in operation, the platform 110 supports the substrate 210, the first ultraviolet lamp 120 provides first ultraviolet light L1, and the second ultraviolet lamp 140 provides second ultraviolet light L2. The ozone supplier 130 having the first nozzle 132 introduces ozone 134 toward the substrate 210 through the first and second ultraviolet lights L1, L2, such that the first and second ultraviolet lights L1, L2 may irradiate the ozone 134 at the same time. As a result, at least a part of the ozone 134 is decomposed by the first ultraviolet light L1, and at least a part of the decomposed ozone reaches the photoresist layer 220 to react with the photoresist layer 220. The decomposed part of the ozone 134 may be decomposed into atomic oxygen 136a and dioxygen 138 (i.e., $O_2$) by the first ultraviolet light L1.

In some embodiments, the second ultraviolet lamp 140 is configured to provide the second ultraviolet light L2 to decompose at least a part of the dioxygen 138, such that at least a part of the decomposed dioxygen reaches the photoresist layer 220 to react with the photoresist layer 220. The decomposed part of the dioxygen 138 and other ambient dioxygen may be decomposed into atomic oxygen 136b by the second ultraviolet light L2. Therefore, the number of the atomic oxygen 136a, 136b is greater than the number of the atomic oxygen 136a shown in FIG. 2.

The UV energy of the first ultraviolet light L1 is about 472 KJ/mol, and the UV energy of the second ultraviolet light L2 is about 647 KJ/mol. Since each of the UV energy of the first ultraviolet light L1 and the UV energy of the second ultraviolet light L2 is greater than the bond energy of the organic molecules of the photoresist layer 220, the atomic oxygen 136a, 136b may react with the organic molecules or the free radicals of the photoresist layer 220 to form other molecules, such as $CO_2$, $H_2O$, $N_2$, etc. As a result, the photoresist layer 220 may be removed from the substrate 210, and the stripping rate of the photoresist layer 220 shown in FIG. 4 is greater than that of the photoresist layer 220 shown in FIG. 2.

It is to be noted that the connection relationships of the components described above will not be repeated in the following description, and only aspects related to a semiconductor apparatus having other components will be described.

Figure 5:
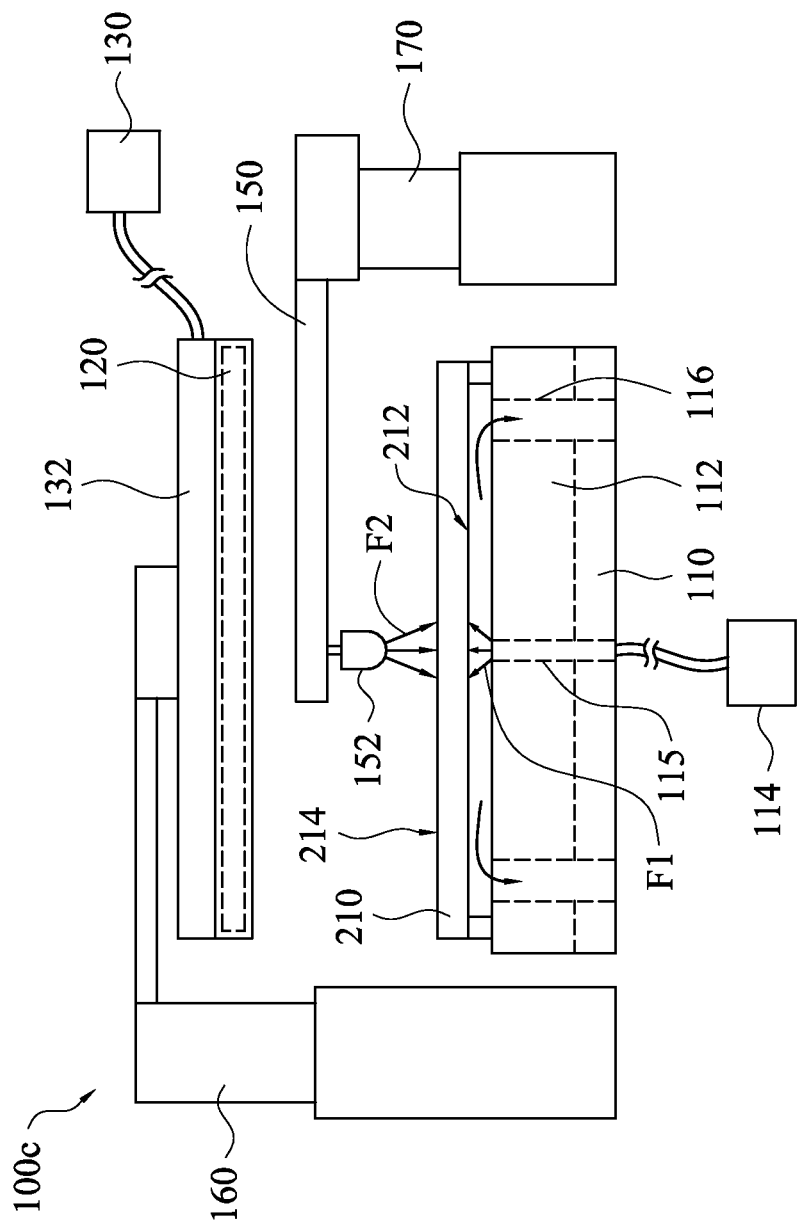
FIG. 5 is a front view of a semiconductor apparatus when being in operation according to some embodiments of the present disclosure.

FIG. 5 is a front view of a semiconductor apparatus 100c when being in operation according to some embodiments of the present disclosure. As shown in FIG. 5, the semiconductor apparatus 100c includes the platform 110, the first ultraviolet lamp 120, and the ozone supplier 130. The ozone supplier 130 has the first nozzle 132. The difference between this embodiment and the embodiment shown in FIG. 1 is that the platform 110 further includes a first liquid supplier 114, and the semiconductor apparatus 100c further includes a second liquid supplier 150. The first liquid supplier 114 has at least one second nozzle 115, and the second liquid supplier 150 has at least one third nozzle 152. The second liquid supplier 150 is movably arranged between the platform 110 and the first ultraviolet lamp 120.

After the photoresist layer 220 is removed from the substrate 210 by the ultraviolet light and the decomposed ozone (e.g., atomic oxygen), the first liquid supplier 114 having the second nozzle 115 may introduce a liquid F1 toward the backside 212 of the substrate 210. As a result, impurities (e.g., dust) on the backside 212 of the substrate 210 may be removed by the liquid F1. In some embodiment, the second nozzle 115 is disposed in the hot plate 112 of the platform 110.

Furthermore, after the photoresist layer 220 is removed from the substrate 210 by the ultraviolet light and the decomposed ozone, the first nozzle 132 and the first ultraviolet lamp 120 may be moved upward away from the platform 110, and thereafter the third nozzle 152 may be moved to a position between the first ultraviolet lamp 120 and the platform 110. Afterwards, the second liquid supplier 150 having the third nozzle 152 may also introduce a liquid F2 toward the front side 214 of the substrate 210. As a result, impurities (e.g., dust or residual photoresist) on the front side 214 of the substrate 210 may be removed by the liquid F2.

In some embodiment, the liquids F1, F2 may be deionized (DI) water or chemical detergents, but the present disclosure is not limited in this regard.

In addition, the platform 110 may further include at least one drain pipe 116. The drain pipe 116 is configured to exhaust the liquids F1, F2. In some embodiments, the drain pipe 116 is disposed in the hot plate 112. When the second nozzle 115 and the drain pipe 116 are disposed in the hot plate 112, the space savings of the semiconductor apparatus 100c may be realized.

Moreover, the semiconductor apparatus 100c may further include moving devices 160, 170. The moving device 160 is connected to the first nozzle 132, such that the first nozzle 132 may be controlled to lift, lower, and rotate above the platform 110 by the moving device 160. The moving device 170 is connected to the third nozzle 152, such that the third nozzle 152 may be controlled to lift, lower, and rotate above the platform 110 by the moving device 170.

For example, when the semiconductor apparatus 100c is in an idle state, the third nozzle 152 may be moved to a position that is not between the first ultraviolet lamp 120 and the platform 110. After the substrate 210 with the a photoresist layer is moved to the platform 110, the first nozzle 132 and the first ultraviolet lamp 120 may be moved downward to approach the substrate 210. After the photoresist layer on the substrate 210 is removed by decomposed ozone and ultraviolet light, the first nozzle 132 and the first ultraviolet lamp 120 may be moved upward, and the third nozzle 152 may be moved to a position that is between the first ultraviolet lamp 120 and the platform 110.

It is to be noted that the connection relationships of the components described above will not be repeated in the following description, and only aspects related to a method of removing a photoresist layer on a substrate will be described.

Figure 6:
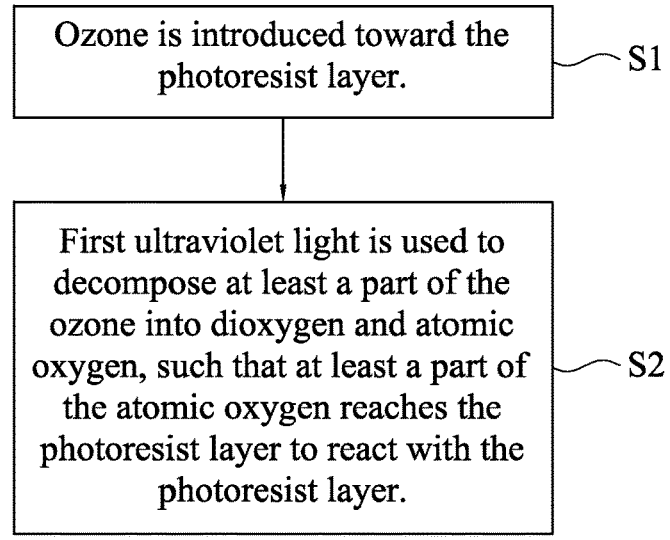
FIG. 6 is a flow chart of a method of removing a photoresist layer on a substrate according to some embodiments of the present disclosure.

FIG. 6 is a flow chart of a method of removing a photoresist layer on a substrate according to some embodiments of the present disclosure. The method of removing the photoresist layer on the substrate includes the following steps. In step S1, ozone is introduced toward the photoresist layer. An ozone supplier having at least one first nozzle may be used to introduce ozone toward the photoresist layer. Thereafter in step S2, first ultraviolet light is used to decompose at least a part of the ozone into dioxygen and atomic oxygen, such that at least a part of the atomic oxygen reaches the photoresist layer to react with the photoresist layer. A first ultraviolet lamp between the first nozzle and the substrate may be used to form the first ultraviolet light to irradiate the ozone and the photoresist layer.

In some embodiments, the first ultraviolet light has a wavelength in a range from about 245 nm to about 260 nm.

The UV energy of the first ultraviolet light that has the aforesaid wavelength is about 472 KJ/mol. Since the UV energy of the first ultraviolet light is greater than the bond energy of the organic molecules of the photoresist layer, the atomic oxygen may react with the organic molecules or the free radicals of the photoresist layer to form other molecules, such as $CO_2$, $H_2O$, $N_2$, etc. As a result, the photoresist layer may be removed from the substrate.

Moreover, the method of removing the photoresist layer on the substrate may further include that second ultraviolet light is used to decompose at least a part of the dioxygen, such that at least a part of the decomposed dioxygen reaches the photoresist layer to react with the photoresist layer. The decomposed part of the dioxygen and other ambient dioxygen may be decomposed into additional atomic oxygen by the second ultraviolet light. A second ultraviolet lamp between the first nozzle and the substrate may be used to form the second ultraviolet light to irradiate the dioxygen and the photoresist layer.

In some embodiments, the second ultraviolet light has a wavelength in a range from about 180 nm to about 190 nm.

The UV energy of the second ultraviolet light that has the aforesaid wavelength is about 647 KJ/mol. Since the UV energy of the second ultraviolet light is greater than the bond energy of the organic molecules of the photoresist layer, the atomic oxygen may react with the organic molecules or the free radicals of the photoresist layer to form other molecules, such as $CO_2$, $H_2O$, $N_2$, etc. As a result, the photoresist layer may be removed from the substrate.

The method of removing the photoresist layer on the substrate may further include that the substrate is heated to increase the reaction rate between the photoresist layer and the atomic oxygen.

After the photoresist layer is removed from the substrate, a liquid may be introduced toward the backside of the substrate by a first liquid supplier having at least one second nozzle. Moreover, another liquid may be introduced toward the front side of the substrate by a second liquid supplier having at least one third nozzle. Therefore, the aforesaid liquids may respectively clean the backside and the front side of the substrate.

In some embodiments, the liquids may be exhausted by at least one drain pipe under the substrate.

Figure 7:
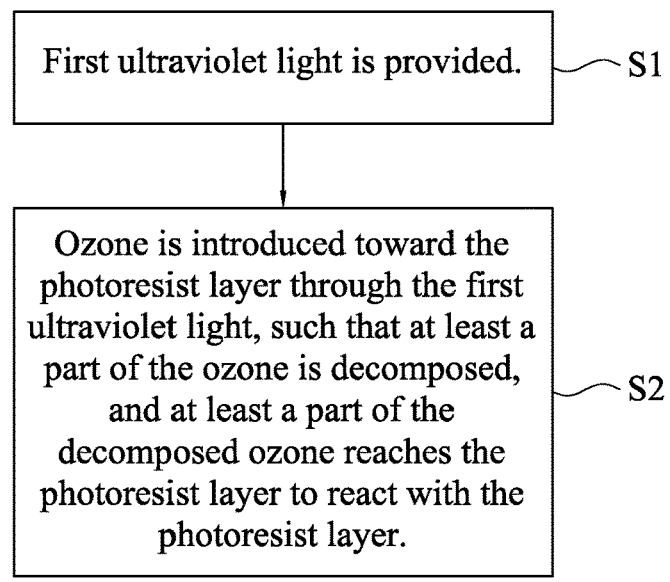
FIG. 7 is a flow chart of a method of removing a photoresist layer on a substrate according to some embodiments of the present disclosure.

FIG. 7 is a flow chart of a method of removing a photoresist layer on a substrate according to some embodiments of the present disclosure. The method of removing the photoresist layer on the substrate includes the following steps. In step S1, first ultraviolet light is provided. A first ultraviolet lamp above the substrate may be used to form the first ultraviolet light. Thereafter in step S2, ozone is introduced toward the photoresist layer through the first ultraviolet light, such that at least a part of the ozone is decomposed, and at least a part of the decomposed ozone reaches the photoresist layer to react with the photoresist layer. An ozone supplier having at least one first nozzle may be used to introduce ozone toward the photoresist layer, and the first ultraviolet light irradiates the ozone and the photoresist layer.

In some embodiments, the first ultraviolet light has a wavelength in a range from about 245 nm to about 260 nm.

Moreover, the decomposed part of the ozone is decomposed into dioxygen and atomic oxygen by the first ultraviolet light. The UV energy of the first ultraviolet light that has the aforesaid wavelength is about 472 KJ/mol. Since the UV energy of the first ultraviolet light is greater than the bond energy of the organic molecules of the photoresist layer, the atomic oxygen may react with the organic molecules or the free radicals of the photoresist layer to form other molecules, such as $CO_2$, $H_2O$, $N_2$, etc. As a result, the photoresist layer may be removed from the substrate.

The method of removing the photoresist layer on the substrate includes that second ultraviolet light is used to decompose at least a part of the dioxygen, such that at least a part of the decomposed dioxygen reaches the photoresist layer to react with the photoresist layer. A second ultraviolet lamp between the first nozzle and the substrate may be used to form the second ultraviolet light to irradiate the dioxygen and the photoresist layer.

In some embodiments, the second ultraviolet light has a wavelength in a range from about 180 nm to about 190 nm.

The UV energy of the second ultraviolet light that has the aforesaid wavelength is about 647 KJ/mol. Since the UV energy of the second ultraviolet light is greater than the bond energy of the organic molecules of the photoresist layer, the atomic oxygen may react with the organic molecules or the free radicals of the photoresist layer to form other molecules, such as $CO_2$, $H_2O$, $N_2$, etc. As a result, the photoresist layer may be removed from the substrate.

The method of removing the photoresist layer on the substrate may further include that the substrate is heated to increase the reaction rate between the photoresist layer and the decomposed ozone.

In order to prevent using Caro's acid to strip a photoresist layer on a substrate, a semiconductor apparatus and a method of removing a photoresist layer are designed to remove a photoresist layer on a substrate. When the semiconductor apparatus is in operation, an ultraviolet lamp provides ultraviolet light, and an ozone supplier having a nozzle introduces ozone toward the substrate through the ultraviolet light, such that the ultraviolet light irradiates the ozone. As a result, at least a part of the ozone is decomposed by the ultraviolet light, and at least a part of the decomposed ozone reaches the photoresist layer to react with the photoresist layer, thereby removing the photoresist layer. Moreover, since thermal stress of conventional Caro's acid does not occur in the semiconductor apparatus, poly damages and poly peeling defects are not apt to be formed on the substrate after the photoresist layer is removed by the semiconductor apparatus.

According to some embodiments, a semiconductor apparatus for removing a photoresist layer on a substrate is provided. The semiconductor apparatus includes a platform, a first ultraviolet lamp, and an ozone supplier. The platform is used to support the substrate. The first ultraviolet lamp is used to provide first ultraviolet light. The ozone supplier has at least one first nozzle for introducing ozone toward the substrate through the first ultraviolet light, such that at least a part of the ozone is decomposed by the first ultraviolet light, and at least a part of the decomposed ozone reaches the photoresist layer to react with the photoresist layer.

According to some embodiments, a method of removing a photoresist layer on a substrate is provided. The method includes the following steps. Ozone is introduced toward the photoresist layer. First ultraviolet light is used to decompose at least a part of the ozone into dioxygen and atomic oxygen, such that at least a part of the atomic oxygen reaches the photoresist layer to react with the photoresist layer.

According to some embodiments, a method of removing a photoresist layer on a substrate is provided. The method includes the following steps. First ultraviolet light is provided. Ozone is introduced toward the photoresist layer through the first ultraviolet light, such that at least a part of the ozone is decomposed, and at least a part of the decomposed ozone reaches the photoresist layer to react with the photoresist layer.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor apparatus for removing a photoresist layer on a substrate, comprising:
   a platform for supporting the substrate;
   a first ultraviolet lamp for providing first ultraviolet light;
   a second ultraviolet lamp for providing second ultraviolet light, wherein the first and second ultraviolet lamps are one above the other;
   an ozone supplier having at least one first nozzle movably arranged relative to the platform for introducing ozone toward the substrate through the first ultraviolet light, such that at least a part of the ozone is decomposed by the first ultraviolet light, and at least a part of the decomposed ozone reaches the photoresist layer to react with the photoresist layer, wherein the first ultraviolet lamp is disposed between the platform and the first nozzle;
   a first moving device for lifting the first nozzle;
   a second nozzle for introducing a liquid to the substrate; and
   a second moving device for rotating the second nozzle, wherein the first and second moving devices are at different sides of the platform.

2. The semiconductor apparatus of claim 1, wherein the first ultraviolet light has a wavelength in a range from about 245 nm to about 260 nm.

3. The semiconductor apparatus of claim 1, wherein the decomposed part of the ozone is decomposed into dioxygen and atomic oxygen by the first ultraviolet light, and at least a part of the dioxygen is decomposed by the second ultraviolet light, such that at least a part of the decomposed dioxygen reaches the photoresist layer to react with the photoresist layer.

4. The semiconductor apparatus of claim 3, wherein the second ultraviolet light has a wavelength in a range from about 180 nm to about 190 nm.

5. The semiconductor apparatus of claim 1, wherein the platform comprises:
   a hot plate configured to heat the substrate.

6. The semiconductor apparatus of claim 5, wherein the platform comprises:
   a first liquid supplier having at least one third nozzle for introducing a liquid toward a backside of the substrate.

7. The semiconductor apparatus of claim 6, wherein the third nozzle is disposed in the hot plate.

8. The semiconductor apparatus of claim 6, wherein the platform comprises:
   at least one drain pipe configured to exhaust the liquid.

9. The semiconductor apparatus of claim 8, wherein the drain pipe is disposed in the hot plate.

10. The semiconductor apparatus of claim 1, further comprising:
    a second liquid supplier movably arranged between the platform and the first ultraviolet lamp, wherein the second liquid supplier has the second nozzle for introducing a liquid toward a front side of the substrate.

11. The semiconductor apparatus of claim 1, wherein the first moving device is coupled to and configured to rotate the first nozzle.

12. The semiconductor apparatus of claim 1, wherein the first ultraviolet lamp is arranged movably with the first nozzle.

13. A method of removing a photoresist layer on a substrate, the method comprising:
    introducing ozone toward the photoresist layer through a first nozzle;
    providing first ultraviolet light by a lamp to decompose at least a part of the ozone into dioxygen and atomic oxygen, such that at least a part of the atomic oxygen reaches the photoresist layer to react with the photoresist layer;
    lifting the first nozzle by a first moving device at a first side of the substrate;
    rotating a second nozzle by a second moving device at a second side of the substrate opposite the first side of the substrate; and
    introducing a first liquid downward to the substrate through the second nozzle.

14. The method of removing the photoresist layer on the substrate of claim 13, wherein the first ultraviolet light has a wavelength in a range from about 245 nm to about 260 nm.

15. The method of removing the photoresist layer on the substrate of claim 13, further comprising:
    using second ultraviolet light to decompose at least a part of the dioxygen, such that at least a part of the decomposed dioxygen reaches the photoresist layer to react with the photoresist layer.

16. The method of removing the photoresist layer on the substrate of claim 15, wherein the second ultraviolet light has a wavelength in a range from about 180 nm to about 190 nm.

17. The method of removing the photoresist layer on the substrate of claim 13, further comprising:
    heating the substrate to increase a reaction rate between the photoresist layer and the atomic oxygen.

18. The method of removing the photoresist layer on the substrate of claim 13, further comprising:
    introducing a second liquid upward to the substrate; and
    exhausting the second liquid.

19. A method of removing a photoresist layer on a substrate, the method comprising:
    providing first ultraviolet light by a lamp disposed above the photoresist layer;
    introducing ozone through a first nozzle toward the photoresist layer through the lamp such that at least a part of the ozone is decomposed by the first ultraviolet light, and at least a part of the decomposed ozone reaches the photoresist layer to react with the photoresist layer;
    lifting the first nozzle by a first moving device at a first side of the substrate;
    rotating a second nozzle by a second moving device at a second side of the substrate different from the first side of the substrate; and
    introducing a liquid to the substrate through the second nozzle.

20. The method of removing the photoresist layer on the substrate of claim 19, wherein the decomposed part of the ozone is decomposed into dioxygen and atomic oxygen by the first ultraviolet light, further comprising:
    using second ultraviolet light to decompose at least a part of the dioxygen, such that at least a part of the decomposed dioxygen reaches the photoresist layer to react with the photoresist layer.

21. The method of removing the photoresist layer on the substrate of claim 19, further comprising:
    heating the substrate to increase a reaction rate between the photoresist layer and the decomposed ozone.

* * * * *